US005327627A

United States Patent [19]

Ochiai et al.

[11] Patent Number: 5,327,627

[45] Date of Patent: Jul. 12, 1994

[54] METHOD OF MANUFACTURING A HIGH-DENSITY PRINT HEAD INCORPORATING PIEZOELECTRIC MEMBERS

[75] Inventors: Kuniaki Ochiai; Toshio Miyazawa, both of Shizuoka, Japan

[73] Assignee: Tokyo Electric Co., Ltd., Tokyo, Japan

[21] Appl. No.: 37,807

[22] Filed: Mar. 26, 1993

[30] Foreign Application Priority Data

Mar. 26, 1992 [JP] Japan .................................. 4-067991

[51] Int. Cl.[5] ............................................ H01L 41/22

[52] U.S. Cl. .................................. 29/25.35; 29/890.1

[58] Field of Search ............................ 29/25.35, 890.1; 310/348; 346/140 R, 141

[56] References Cited

FOREIGN PATENT DOCUMENTS 55-86767 6/1980 Japan .
63-252750 10/1988 Japan .
2-150355 6/1990 Japan .

*Primary Examiner*—Carl E. Hall

*Attorney, Agent, or Firm*—Oblon, Spivak, McClelland, Maier & Neustadt

[57] ABSTRACT

A method of manufacturing a print head for an ink-jet printer comprises steps of: forming a main plate (1) by superposing a first piezoelectric plate (2), a first low-rigidity plate (5), a second low-rigidity plate (6) and a second piezoelectric plate (3) in that order in a laminated structure; cutting a plurality of parallel first and second grooves (7, 9) through the first piezoelectric plate into the first low-rigidity plate and through the second piezoelectric plate into the second low-rigidity plate, respectively, by grinding to form first and second walls (8, 10); forming first and second electrodes (14, 15) respectively over the side surfaces of the first and second walls (8, 10); attaching a top plate (17) and a bottom plate (18) respectively to the outer surfaces of the first and second piezoelectric plates (2, 3) to form first and second pressure chambers (22, 23) respectively in the opposite sides of the main plate (1); and attaching an orifice plate (20) provided with a plurality of ink jets (19) to the end surface of the main plate (1) so that the ink jets (19) coincide respectively with the first and second pressure chambers (22, 23).

8 Claims, 7 Drawing Sheets

METHOD OF MANUFACTURING A HIGH-DENSITY PRINT HEAD INCORPORATING PIEZOELECTRIC MEMBERS

BACKGROUND OF THE INVENTION

1. Field of the Invention

The present invention relates to a method of manufacturing an on-demand type print head suitable for use on an ink-jet printer for printing characters on a recording sheet of paper with a liquid ink.

2. Description of the Related Art

A first prior art print head for an ink-jet printer, disclosed in Japanese Patent Laid-open (Kokai) No. 55-86767 will be described with reference to FIGS. 8 to 10. As shown in FIG. 8, this prior art print head has an inner plate 30 and outer plates 31 attached adhesively to the opposite surfaces of the inner plate 30, respectively. As shown in FIG. 9, an ink pool 32 for storing the ink, a plurality of pressure pits 33 connected to the ink pool 32, a plurality of passages 34 extending respectively from the pressure pits 33, and a plurality of nozzles 35 connected respectively to the extremities of the passages 34 are formed in each of the opposite surfaces of the inner plate 30. The nozzles 35 are staggered on the opposite surfaces of the inner plate 30 as shown in FIG. 8 and open in one end surface of the inner plate 30 as shown in FIG. 10. As shown in FIG. 8, piezoelectric elements 36 are joined to the outer surfaces of the outer plates 31 at positions corresponding to the pressure pits 33, respectively. Voltage is applied selectively to the piezoelectric elements 36 to pressurize the corresponding pressure pits 33 to jet the ink through the corresponding nozzles 35. Since the nozzles 35 are arranged at a small pitch in two rows, the number of the nozzles 35 may be considerably large and the nozzles 35 can be arranged in a high density. However, since the nozzles 35 are connected to the wide pressure pits 33 by the curved passages 34, the pressure pits 33 and the passages 34 occupy a large space on the inner plate 30 and the number of the nozzles 35 is limited by the space available for arranging the pressure pits 33 and the passages 34.

Referring to FIG. 11 showing a second prior art print head disclosed in Japanese Patent Laid-open (Kokai) No. 63-252750, pairs of walls 39 and 40 formed by machining a pair of piezoelectric ceramic plates 44 and 45 are sandwiched between glass plates 37 and 38 so as to form pressure chambers 41 between the adjacent pairs of walls 39 and 40. A nozzle 42 is formed at one end of each pressure chamber 41 and electrodes 43 are attached to the side surfaces of the walls 39 and 40 facing the pressure chambers 41. The internal pressure of a specified pressure chamber 41 is increased by straining a specified pair of walls 39 and 40 by applying a voltage to a specified electrode 43 and grounding the electrodes 43 respectively on the opposite sides of the specified electrode 43 to jet the ink contained in the specified pressure chamber 41 through the nozzle 42.

When fabricating this print head, the piezoelectric ceramic plate 44 is attached to the glass plate 37, the piezoelectric ceramic plate 45 is attached to the glass plate 38, a plurality of grooves are cut in the piezoelectric ceramic plates 44 and 45 by a profile cutting disk to form the walls 39 and 40 on the opposite sides of each groove, and the two piezoelectric ceramic plates 44 and 45 are fixedly joined together with the corresponding walls 39 and 40 joined together end-to-end.

Referring to FIG. 12 showing a third prior art print head disclosed in Japanese Patent Laid-open (Kokai) No. 2-150355, a plurality of parallel grooves 47 are formed in a bottom plate 46 formed of a piezoelectric material and polarized in the direction of the arrows to form side walls 48 and a bottom wall 49. A top plate 51 is attached adhesively to the end surfaces 50 of the side walls 48 with an adhesive 52 to form pressure chambers. An electrode 53 is formed in a substantially half section of each side surface of each side wall 48 on the side of the top plate 51 by evaporation. Then, an ink supply port to be connected to an ink supply unit is formed in one end of each pressure chamber and an ink jet is formed in the other end of the pressure chamber to complete the print head.

When voltages of opposite polarities are applied respectively to the electrodes 53 on the two adjacent side walls 48, the adjacent side walls 48 are strained as indicated by dotted lines in FIG. 12 to increase the internal pressure of the pressure chamber formed between the adjacent side walls 48 and, consequently, the ink contained in the same pressure chamber is jetted through the ink jet.

Although the nozzles 35 of the first prior art print head disclosed in Japanese Patent Laid-open (Kokai) No. 55-86767 shown in FIGS. 8 to 10 can be arranged in a high density, pressure loss occurs in the passages 34 connecting the nozzle 35 to the wide pressure chamber 33 and hence the printer is unable to jet the ink efficiently. Since the passages 34 have different shapes respectively, different degrees of pressure loss occur respectively in the passages 34 and hence the nozzles 35 differ from each other in ink jetting performance. Such disadvantages become significant when the number of the nozzles 35 is increased. Therefore, the number of the nozzles cannot be increased unlimitedly.

In the second prior art print head disclosed in Japanese Patent Laid-open (Kokai) No. 63-252750 shown in FIG. 11, the density of the nozzles 42 is on the order of eight nozzles in 1 mm. Therefore, if the nozzles 42 are arranged in a single row it is impossible to print characters in high print quality and satisfactory resolution. Furthermore, since the end surfaces of the corresponding side walls 39 and 40 need to be aligned in joining together the two piezoelectric ceramic plates 44 and 45, the fabrication of the print head requires difficult work. When forming the electrodes 43 by an evaporation process, metal particles evaporated from an evaporation source are deposited easily on surfaces directly facing the evaporation source and the metal particles can not be easily deposited on surfaces extending obliquely to the evaporation source. Accordingly, the metal particles can be easily deposited on the end surfaces of the side walls 39 and 40 directly facing the evaporation source and it is difficult to deposit the metal particles on the side surfaces of the side walls 39 and 40 not facing the evaporation source and pinholes are liable to be formed in the electrodes 43. Therefore, it is impossible to apply an electric field uniformly to the piezoelectric ceramic plates 44 and 45. If pinholes are formed in the electrodes 43, the ink penetrates the electrodes 43 through the pinholes to corrode the piezoelectric ceramic plates 44 and 45. Still further, the evaporation process needs an expensive vacuum evaporation system and hence the electrodes 43 are costly.

In the third prior art print head disclosed in Japanese Patent Laid-open (Kokai) No. 2-150355 shown in FIG. 12, a stress to distort the side wall 48 is induced only in the upper portion of the side wall 48, and the lower portion of the side wall 48 not provided with the electrode 53 resists the distortion of the upper portion of the side wall 48. Since the side wall 48 is formed of a piezoelectric material having a high rigidity, the resistance of the lower portion of the side wall 48 makes the distortion of the upper portion of the side wall 48 further difficult, which deteriorates the ink jetting performance of the print head. Such a problem may be solved by applying a very high voltage to the electrodes 53 or by forming the side walls 48 in a very large height. However, application of a very high voltage to the electrodes 53 deteriorates the polarization of the side walls 48 and machining cost increases when the height of the side walls 48 is increased.

SUMMARY OF THE INVENTION

Accordingly, it is an object of the present invention to provide a method of manufacturing a high-density print head for an ink-jet printer, incorporating piezoelectric members and provided with ink jets arranged in a high density.

Another object of the present invention is to provide a method of manufacturing a print head for an ink-jet printer, facilitating work for joining together the component plates and the main plate of the print head.

A method in one aspect of the present invention of manufacturing a print head for an ink-jet printer comprises steps of: forming a laminated main plate by laminating a first piezoelectric plate polarized in the direction of its thickness, a second piezoelectric plate polarized in the direction of its thickness, a first low-rigidity plate having a rigidity lower than that of the first piezoelectric plate and contiguous with the inner surface of the first piezoelectric plate, a second low-rigidity plate having a rigidity lower than that of the second piezoelectric plate and contiguous with the inner surface of the second piezoelectric plate; cutting a plurality of parallel first grooves by grinding through the first piezoelectric plate into the first low-rigidity plate to form parallel first walls between the parallel first grooves; cutting a plurality of parallel second grooves by grinding through the second piezoelectric plate into the second low-rigidity plate with reference to a reference position for cutting the first grooves to form parallel second walls; forming first electrodes on the side surfaces of the first walls; forming second electrodes on the side surfaces of the second walls; attaching a top plate to the outer surface of the first piezoelectric plate to form a plurality of first pressure chambers between the first walls; attaching a bottom plate to the outer surface of the second piezoelectric plate to form a plurality of second pressure chambers between the second walls; and attaching an orifice plate provided with a plurality of ink jets to the main plate so that the ink jets coincide with the first and second pressure chambers, respectively.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Figure 1A:
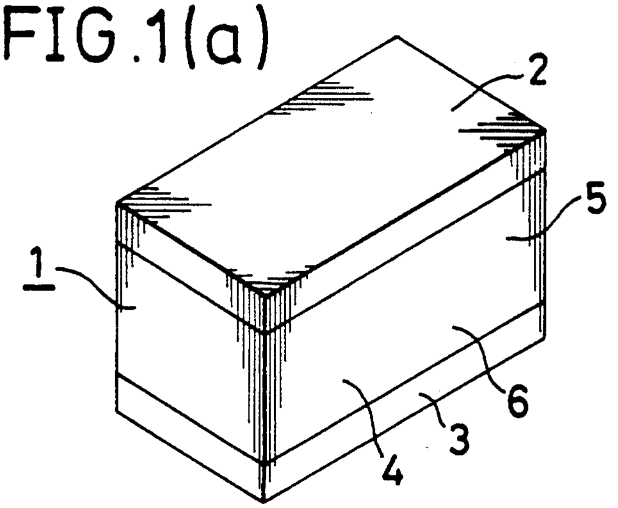
FIGS. 1(*a*), 1(*b*) and 1(*c*) are perspective views of assistance in explaining a method of manufacturing a print head, in a preferred embodiment according to the present invention.
Figure 1B:
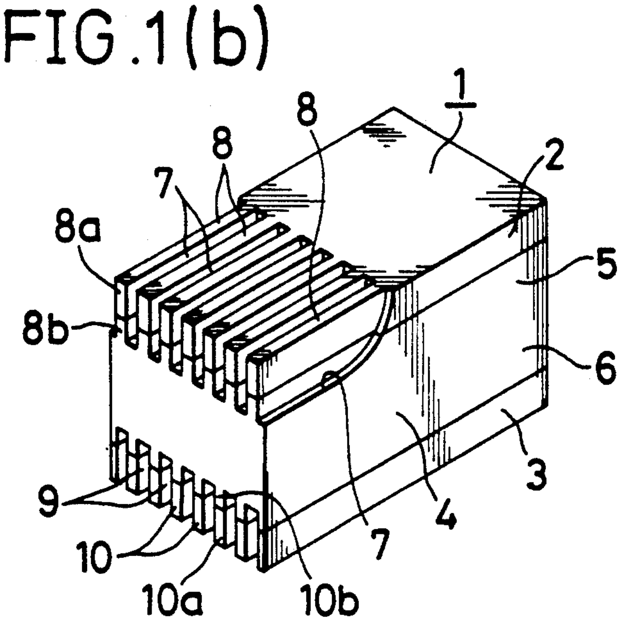
Figure 1C:
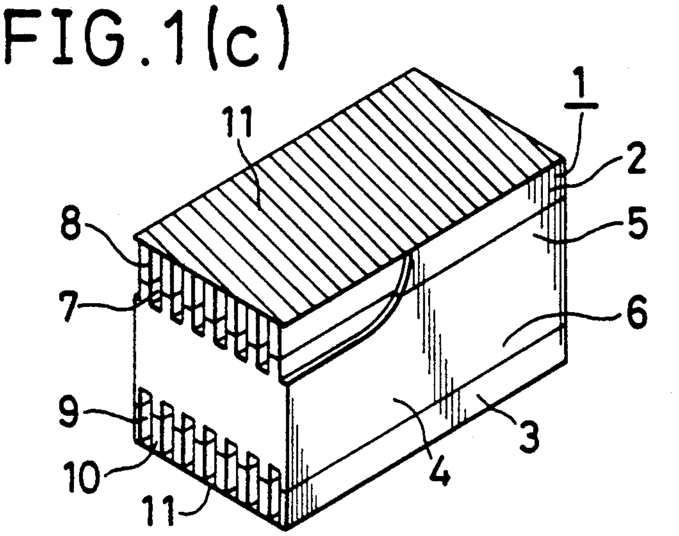

The construction of a print head to be manufactured by a print head manufacturing method in a preferred embodiment according to the present invention will be described with reference to FIGS. 1(*a*) to 1(*c*), 2(*a*), 2(*b*) and 3(*a*) to 3(*c*) showing the sequential steps of the print head manufacturing method. Referring to FIG. 1(*a*), a main plate 1 is fabricated by forming a low-rigidity block 4 of a material containing an epoxy resin as a principal component in a space formed between a first piezoelectric plate 2 polarized in the direction of its thickness and a second piezoelectric plate 3 polarized in the direction of its thickness. The rigidity of the hardened low-rigidity block 4 is lower than those of the piezoelectric plates 2 and 3. The low-rigidity block 4 serves as a first low-rigidity plate 5 contiguous with the inner surface of the first piezoelectric plate 2 and a second low-rigidity plate 6 contiguous with the inner surface of the second piezoelectric plate 3. The low-rigidity block 4 is formed of a structural adhesive processed for defoaming to eliminate bubbles. Desirably, the hardening temperature of the low-rigidity block 4 is 130° C. or below to avoid the deterioration of polarization of the piezoelectric plates 2 and 3. In this embodiment, the low-rigidity block 4 is formed of an adhesive No. 2651, Guresu Japan.

As shown in FIG. 1(*b*), a plurality of parallel first grooves 7 are formed at a predetermined pitch by grinding through the first piezoelectric plate 2 into the low-rigidity block 4 to form first walls 8 on the opposite sides of the first grooves 7. Thus, each first wall 8 consists of a high-rigidity portion 8*a* formed of a portion of the first piezoelectric plate 2, and a low-rigidity portion 8*b* formed of a portion of the low-rigidity block 4 having a rigidity lower than that of the first piezoelectric plate 2. Then, a plurality of parallel second grooves 9 are formed at a predetermined pitch by grinding through the second piezoelectric plate 3 into the low-rigidity block 4 to form second walls 10 on the opposite sides of the second grooves 9. Each second wall has a high-rigidity portion 10*a* formed of a portion of the second piezoelectric plate 3, and a low-rigidity portion

10*b* formed of a portion of the low-rigidity block 4. In this embodiment, the first grooves 7 and the second grooves 9 are 86 μm in width, 375 μm in depth and 12 mm in length, and arranged at a pitch of 169 μm. The piezoelectric plates 2 and 3 are 240 μm in thickness. The grooves 7 and 9 are formed by a dicing machine using a diamond grinding wheel for cutting a wafer into dice from which IC chips are fabricated. In this embodiment, a 2 in. blade No. NBCZ1080 or NBCZ1090 (Disco Co.) was used for forming the grooves 7 and 9, in which the blade was rotated at 30,000 rpm.

Then, the work, i.e., the main plate 1 provided with the grooves 7 and 9, and the walls 8 and 10, is subjected to electroless plating. Prior to subjecting the work to electroless plating, the work is subjected to a washing process, a catalyzing process and an accelerating process for pretreatment. The work is processed by the washing process to activate the surfaces to be plated and to enhance the hydrophilic property of the surfaces of the work so that a catalyzing solution and a plating solution can easily flow into the grooves 7 and 9. In this embodiment, an ethanol solution was used for cleaning. In the catalyzing process, the main plate 1 is immersed in a catalyzing solution containing palladium chloride, stannous chloride and undiluted hydrochloride acid to form a layer of a complex of Pd and Sn over the surfaces of the grooves 7 and 9. In the accelerating process, the main plate 1 is immersed in a liquid, such as a sulfuric acid solution to remove Sn from the complex formed by the catalyzing process so that only metal Pd remains on the surfaces of the grooves 7 and 9. The surfaces of the grooves 7 and 9 can be satisfactorily pretreated and uniform films can be formed over the surfaces of the grooves 7 and 9 when the relative speed of the work, i.e., the main plate 1, with respect to the processing solutions in the catalyzing process and the accelerating process is 0.2 m/sec or higher.

Figure 2A:
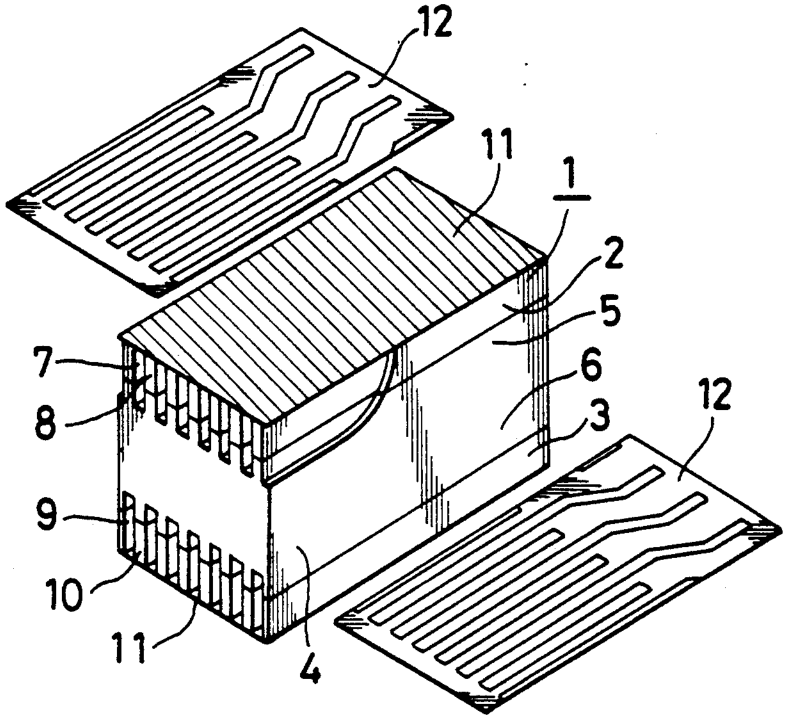
FIGS. 2(*a*) and 2(*b*) are perspective views of assistance in explaining steps of manufacturing a print head.
Figure 2B:
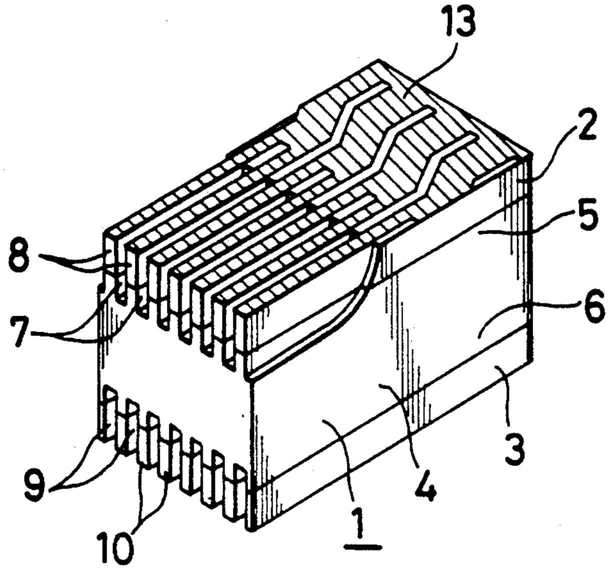

Then, masks provided with wiring patterns are respectively formed on the outer surfaces of the first piezoelectric plate 2 and the second piezoelectric plate 3 by the following processes. Dry films 11 are applied to the outer surfaces of the first piezoelectric plate 2 and the second piezoelectric plate 3, respectively, as shown in FIG. 1(*c*). Resist masks 12 on which wiring patterns are formed as shown in FIG. 2(*a*) are placed on the dry films 11, respectively. Then the main plate 1 is subjected to an exposure process and a developing process to form resist masks 13 of the dry films 11 covering the surfaces of the first piezoelectric plate 2 and the second piezoelectric plate 3. However, the resist masks 13 are formed excluding regions corresponding to the grooves 7 and 9 and wiring pattern forming regions in which wiring patterns are to be formed. In this state, metal Pd is exposed in the wiring pattern forming regions of the piezoelectric plates 2 and 3, and on the side surfaces of the walls 8 and 10.

Figure 3A:
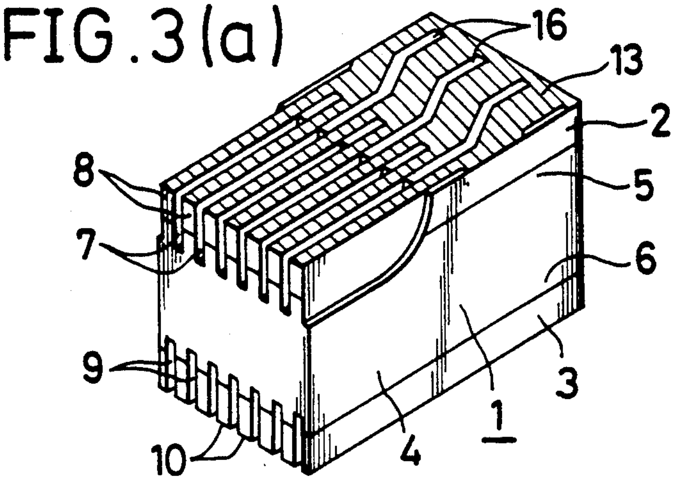
FIGS. 3(*a*), 3(*b*) and 3(*c*) are perspective views of assistance in explaining steps of manufacturing a print head.
Figure 3B:
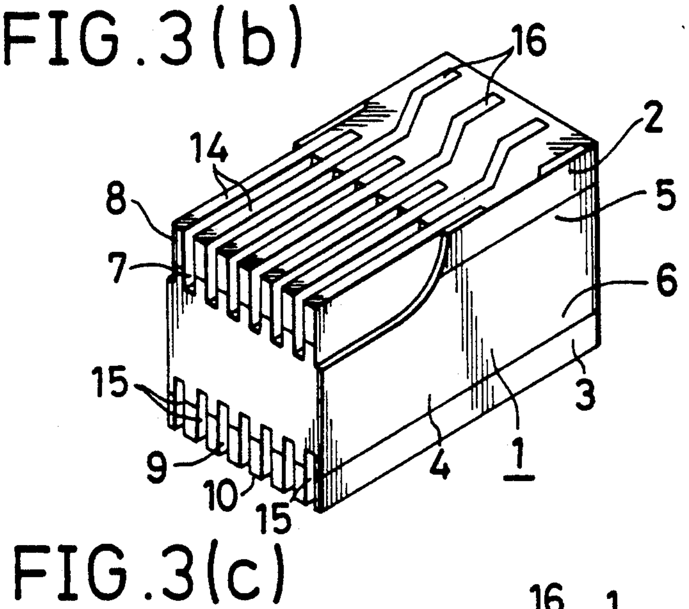
Figure 3C:
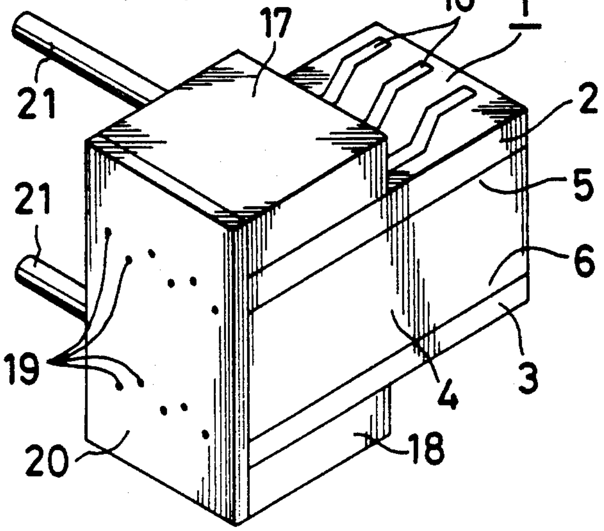

Then, the main plate 1 is immersed in a plating solution for electroless plating containing a metal salt and a reducing agent, as principal components, a pH regulator, a buffer, a complexing agent, an accelerating agent and a modifier. When the main plate 1 is immersed in the plating solution, the metal is deposited in the regions coated with the metal Pd and is not deposited in regions covered with the resist masks 13. That is, only the side surfaces of the walls 8 and 10 and the wiring pattern forming regions in the surfaces of the piezoelectric plates 2 and 3 are plated as shown in FIG. 3(*a*).

Figure 4:
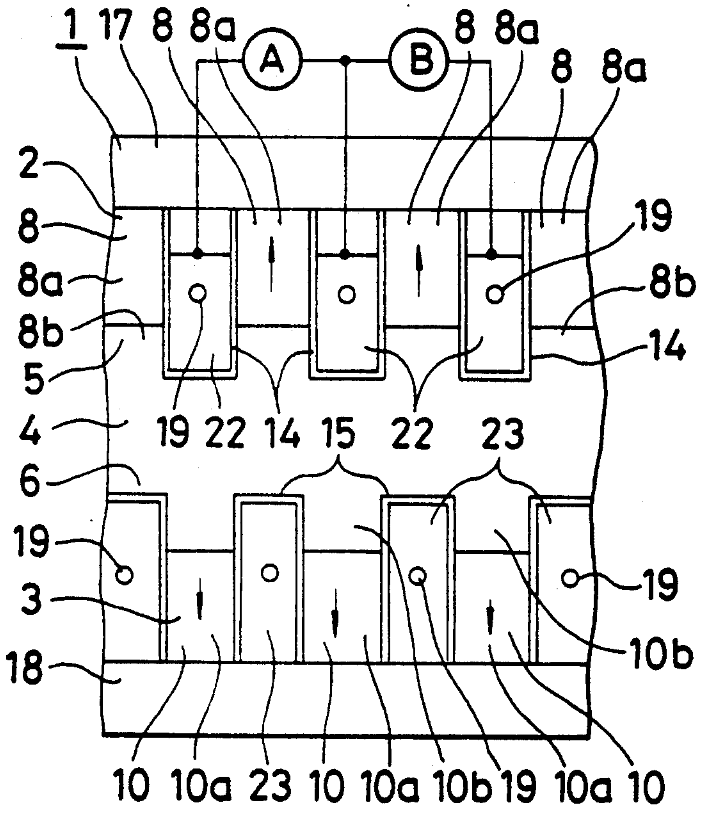
FIG. 4 is a longitudinal sectional front view of a print head.

Then, the resist films 13 are removed from the surfaces of the piezoelectric plates 2 and 3. Thus, first electrodes 14, second electrodes 15 and wiring patterns 16 are formed by electroless plating as shown in FIG. 3(*b*). In this embodiment, uniform Ni films of a thickness in the range of 1 to 2 μm not having any pinholes were formed over the rough surfaces of the piezoelectric plates 2 and 3 formed of particles of particle size in the range of 2 to 4 μm and over the exposed surfaces of the low-rigidity block 4 (the low-rigidity plates 5 and 6). Then, as shown in FIG. 3(*c*), a top plate 17 is attached adhesively to the outer surface of the first piezoelectric plate 2. A bottom plate 18 is attached adhesively to the outer surface of the second piezoelectric plate 3. An orifice plate 20 provided with a plurality of ink jets 19 is attached to one end of the main plate 1 so that the ink jets 19 coincide respectively with the grooves 7 and 9. Ink supply pipes 21 are connected respectively to the top plate 17 and the bottom plate 18 to complete a print head. When the print head is used, the ink supply pipes 21 are connected to an ink source. The open ends of the first grooves 7 are closed by the top plate 17 to form a plurality of first pressure chambers 22. The open ends of the second grooves 9 are closed by the bottom plates 18 to form a plurality of second pressure chambers 23 as shown in FIG. 4.

The operation of the print head thus constructed in jetting the ink contained in the middle first pressure chamber 22 in FIG. 4 will be explained. The ink is supplied from the ink source through the ink supply pipe 21 (FIG. 3(*c*)) to the first pressure chambers 22. A voltage A is applied through the wiring pattern 16 across the first electrode 14 for the middle first pressure chamber 22 and the first electrode 14 for the first pressure chamber 22 on the left-hand side of the middle first pressure chamber 22 (hereinafter referred to "the left first pressure chamber"). A voltage B of a polarity opposite to that of the voltage A is applied through the wiring pattern 16 across the first electrode 14 for the middle first pressure chamber 22 and the first electrode 14 for the first pressure chamber 22 on the right-hand side of the middle first pressure chamber 22 (hereinafter referred to as "the right first pressure chamber"). An electric field of a direction perpendicular to the direction of polarization indicated by the arrows is applied to the high-rigidity portions 8*a* of the first walls 8. Consequently, the first wall 8 on the left-hand side of the middle first pressure chamber 22 (hereinafter referred to as "the left first wall") is strained to the left and the first wall 8 on the right-hand side of the middle first pressure chamber 22 (hereinafter referred to as "right first wall") is strained to the right, so that the volume of the middle first pressure chamber 22 increases and those of the right and left first pressure chambers 22 on the opposite sides of the middle first pressure chamber 22 decrease.

Figure 5:
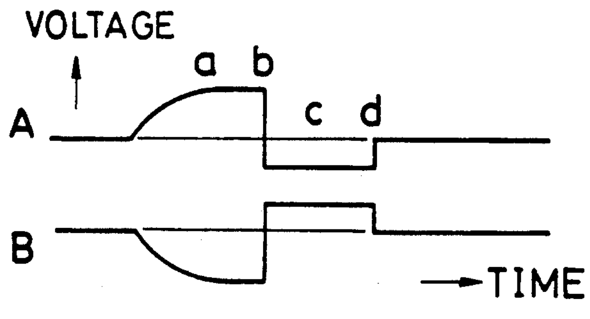
FIG. 5 is a time chart showing the timing of applying a voltage to an electrode.

FIG. 5 shows a mode of application of the voltages A and B across the first electrodes 14. As shown in FIG. 5, the absolute values of the voltages A and B are increased gradually in a predetermined period a so that the volumes of the right and left first pressure chambers 22 decrease gradually and hence the ink contained in the right and left first pressure chambers 22 is not jetted through the ink jets 19. Since the volume of the middle first pressure chamber 22 increases, the internal pressure of the middle pressure chamber 22 decreases to draw the ink through the ink supply pipe 21 from the ink source. At time b, the polarities of the voltages A and B are reversed instantaneously. Then, the left first wall 8 is strained to the right and the right first wall 8 is strained to the left, so that the volume of the middle first pressure chamber 22 decreases suddenly. Consequently, the ink contained in the middle first pressure chamber 22 is jetted through the ink jet 19. After the polarities of the voltages A and B have been reversed, the voltages A and B are maintained for a predetermined period c. During the period c, the tail of a droplet of the ink extruded through the ink jet 19 is continuous with the ink jet 19. At time d, the voltages A and B applied across the first electrodes 14 are removed suddenly. Consequently, the strained right and left first walls 8 restore their original shapes, the internal pressure of the middle first pressure chamber 22 decreases instantaneously and the ink filling the ink jet 19 is drawn into the middle first pressure chamber 22, so that the tail of the droplet of the ink is separated from the ink jet 19. Although the respective internal pressures of the right and left first pressure chambers 22 increase at the moment when the voltages A and B applied across the first electrodes 14 are removed, the internal pressures do not increase to a pressure high enough to jet the ink. The ink contained in other first pressure chambers 22 and the second pressure chambers 23 is jetted by the same method.

As stated above, each first wall 8 consists of the high-rigidity portion 8*a* formed of a portion of the first piezoelectric plate 2, and the low-rigidity portion 8*b* formed of a portion of the low-rigidity block 4 (low-rigidity plate 5), and the rigidity of the low-rigidity portion 8*b* is a small fraction of the rigidity of the high-rigidity portion 8*a*. The resistance of the low-rigidity portion 8*b* against the stress induced in the high-rigidity portion 8*a* is insignificant. Accordingly, the first walls 8 can be greatly distorted to jet the ink from the first pressure chambers 22 effectively. Similarly, each second wall 10 consists of the high-rigidity portion 10*a* and the low-rigidity portion 10*b* and hence the second walls 10 can be greatly distorted to jet the ink from the second pressure chambers 23 effectively.

Thus, voltages of opposite polarities are applied across the first electrodes (the second electrodes) to distort the first walls (the second walls) on the opposite sides of the first pressure chamber (the second pressure chamber) so that the internal pressure of the first pressure chamber (the second pressure chamber) varies and the ink is jetted through the ink jet. Since the narrow first pressure chambers and the narrow second pressure chambers are staggered on two parallel rows, the ink jets can be arranged in a high density. Since the ink jet is formed at one end of each of the first and second pressure chambers, pressure loss can be reduced to a minimum and hence the print head can be provided with an increased number of ink jetting arrangements without taking pressure loss into consideration. Since each of the first walls forming the boundaries of the pressure chambers consists of the high-rigidity portion formed of a portion of the first piezoelectric plate, and the low-rigidity portion formed of a portion of the first low-rigidity plate, the resistance of the low-rigidity portion against the stress induced in the high-rigidity portion is small, so that the first walls can be effectively distorted and, consequently, the ink can be effectively jetted. For the same reason, the second walls, similarly to the first walls, can be effectively distorted and, consequently, the ink can be effectively jetted. Accordingly, relatively low voltages are applied to the first and second piezoelectric plates and hence the deterioration of polarization of the first and second piezoelectric plates due to the application of very high voltages thereto can be avoided. The first and second grooves may be of a relatively small depth, which reduces the manufacturing cost. Since the first and second grooves are formed in the laminated main plate formed by laminating the first piezoelectric plate, the low-rigidity block serving as the first low-rigidity plate and the second low-rigidity plate, and the second piezoelectric plate, the first piezoelectric plate, the low-rigidity block and the second piezoelectric plate need not be precisely stacked in forming the main plate by lamination. The positions of the second pressure chambers relative to the first pressure chambers can be accurately and easily determined with reference to the reference position used for determining the respective positions of the first pressure chambers.

The electroless plating is capable of forming uniform electrodes not having any pinholes over the surfaces of the first and second walls even if the surfaces are rough, which cannot be achieved by evaporation. Accordingly, the first and second piezoelectric plates are not exposed to the ink and not corroded by the ink. Since the electroless plating process is a chemical process, the electrodes can be formed on a large number of main plates at a time, which reduces the electrode forming cost.

The low-rigidity block 4 serving as the low-rigidity plates 5 and 6 may be substituted by a plate of any suitable material, such as a resin plate, provided that the the resin plate has a relatively low rigidity and is nonconductive and nonelectrostrictive. The electrodes need not necessarily be limited to Ni films; it is desirable to form the electrodes by Au films if the ink is corrosive to Ni. The electrodes may consist of a corrosion-resistant film and a film of an inexpensive metal underlying the corrosion-resistant film.

The first electrodes 14 and the second electrodes 15 may be formed only over the side surfaces of the high-rigidity portions 8*a* and 10*a* of the walls 8 and 10 instead of forming the same over the entire side surfaces of the walls 8 and 10 exposed to first and second grooves 7 and 9, respectively. The low-rigidity block 4 is formed of a synthetic resin having a property that the ratio of Sn in the Pd·Sn complex deposited over the side surfaces of the low-rigidity portions 8*b* and 10*b* by catalyzing is greater than that in the Pd·Sn complex deposited over the side surfaces of the high-rigidity portions 8*a* and 10*a*. Conditions for acceleration are regulated so that the composition of the Pd·Sn complex deposited over the side surfaces of the low-rigidity portions 8*b* and 10*b* is not changed and the composition of the Pd·Sn complex deposited over the side surfaces of the high-rigidity portions 8*a* and 10*a* is changed. Thus, only metal Pd remains over the side surfaces of the high-rigidity portions 8*a* and 10*a*. When the electrodes 14 and 15 are formed only over the side surfaces of the high-rigidity portions 8*a* and 10*a*, the rigidity of the low-rigidity portions 8*b* and 10*b* of the walls 8 and 10 is reduced still further and the walls 8 and 10 can be further efficiently strained.

The catalyzing process and the accelerating process for depositing the catalyst on the side surfaces of the walls 8 and 10 may be substituted by a sensitizing process and an activating process. However, it is possible only to form the electrodes 14 and 15 over the entire side surfaces of the side walls 8 and 10.

Voltages may be applied across the electrodes in a mode other than that shown in FIG. 5.

Figure 6:
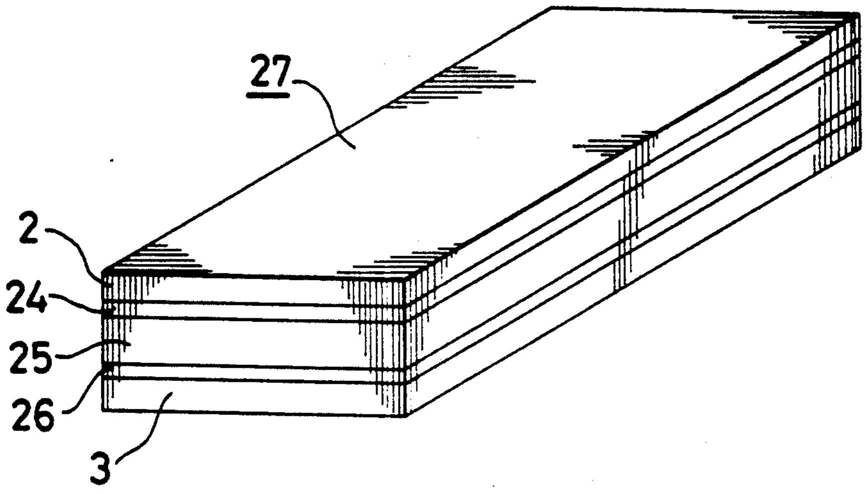
FIG. 6 is a perspective view of a main plate employed in a modification of the main plate shown in FIG. 1(*a*)
Figure 7:
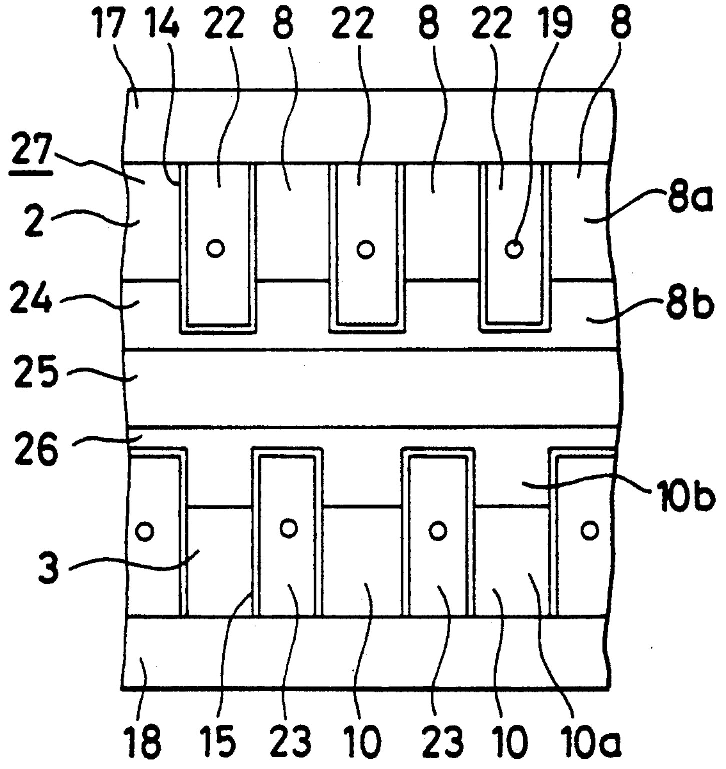
FIG. 7 is a longitudinal sectional front view of a print head.
Figure 8:
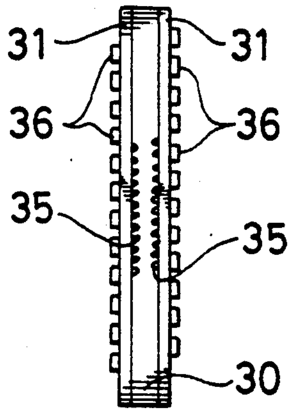
FIG. 8 (PRIOR ART)
FIG. 8 is a side view of a first prior art print head.
Figure 9:
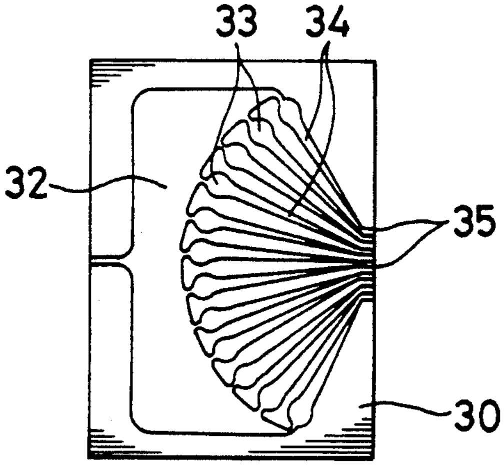
FIG. 9 (PRIOR ART)
FIG. 9 is a plan view of an inner plate of the first prior art print head of FIG. 8.
Figure 10:
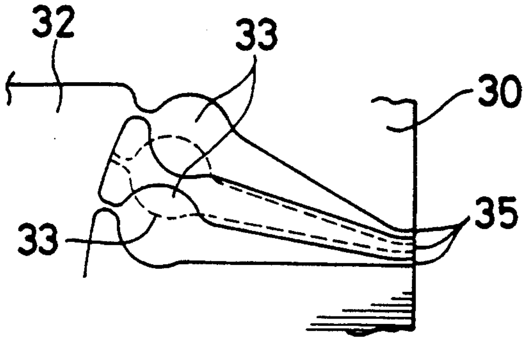
FIG. 10 (PRIOR ART)
FIG. 10 is a fragmentary plan view of the inner plate of FIG. 9.
Figure 11:
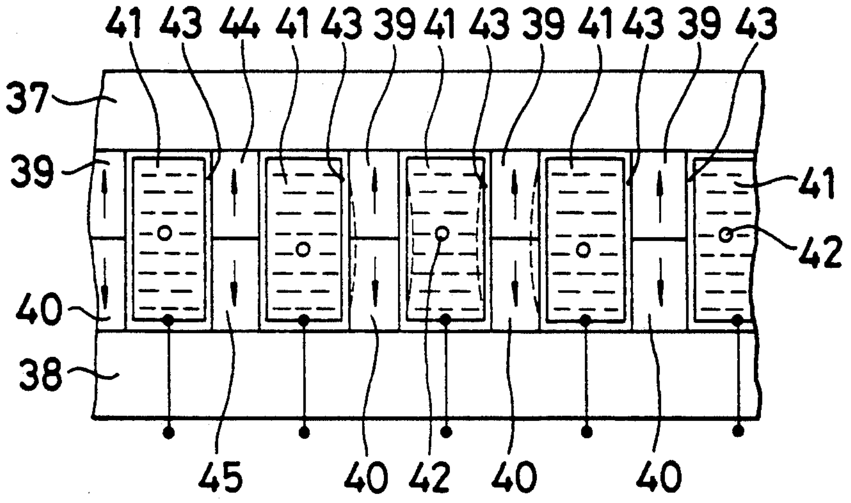
FIG.11 (PRIOR ART)
FIG. 11 is a longitudinal sectional front view of a second prior art print head.
Figure 12:
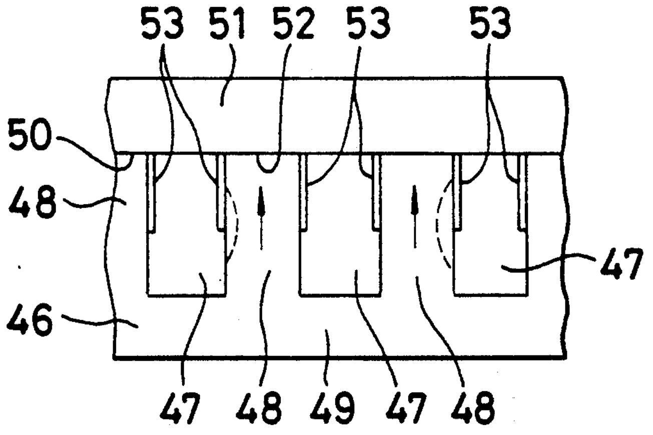
FIG.12 (PRIOR ART)
FIG. 12 is a longitudinal sectional front view of a third prior art print head.

A main plate 27 as shown in FIGS. 6 and 7 may be used instead of the laminated main plate 1 formed by laminating the first piezoelectric plate 2, the low-rigidity block 4 and the second piezoelectric plate 3. As shown in FIG. 6, the main plate 27 is formed by superposing a first piezoelectric plate 2, a structural adhesive film 24, i.e., a first low-rigidity plate, an intermediate plate 25 having a rigidity higher than that of the first low-rigidity plate, a structural adhesive film 26, i.e., a second low-rigidity plate whose rigidity is substantially the same as that of the first low-rigidity plate, and a second piezoelectric plate 3 in a laminated structure. Heat and pressure are applied to the laminated structure to harden the structural adhesive films 24 and 26 and to solidify the laminated structure. First grooves 7 and second grooves 9 are cut respectively from the opposite surfaces of the main plate 27 into the first and second low-rigidity plates 24 and 26 through the first and second piezoelectric plates 2 and 3 to form first walls 8 and second walls 10. First electrodes 14 and second electrodes 15 are formed respectively over the surfaces of the first walls 8 and the second walls 10 exposed to the first and second grooves 7 and 9. However, as stated above, the first and second electrodes 14 and 15 may be formed respectively over at least the side surfaces of portions of the first and second piezoelectric plates 2 and 3 exposed to the first and second grooves 7 and 9, respectively. A top plate 17 is attached adhesively to the outer surface of the first piezoelectric plate 2 to form first pressure chambers 22. A bottom plate 18 is attached adhesively to the outer surface of the second piezoelectric plate 3 to form second pressure chambers 23. Then an orifice plate 20 is attached to the end surface of the main plate 27 to complete a print head, as shown in FIG. 7.

The intermediate plate 25 having a high rigidity strengthens the print head against an external force tending to deform the print head. The structural adhesive films 24 and 26 may be those of any suitable properties, provided that the structural adhesive films are highly adhesive and uniform in thickness, have a relatively low hardening temperature and do not deteriorate the polarization of the piezoelectric plates 2 and 3. A suitable structural adhesive film is, for example, structural adhesive film AF-163-2K provided by Sumitomo 3M K.K.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A method of manufacturing a print head for an ink-jet printer, comprising steps of:

forming a main plate by fixedly laminating a first piezoelectric plate polarized in the direction of its thickness, a second piezoelectric plate polarized in the direction of its thickness, a first low-rigidity plate having a rigidity lower than that of the first piezoelectric plate and contiguous with the inner surface of the first piezoelectric plate and a second low-rigidity plate having a rigidity lower than that of the second piezoelectric plate and contiguous with the inner surface of the second piezoelectric plate;

cutting a plurality of parallel first grooves through the first piezoelectric plate into the first low-rigidity plate by grinding at positions determined with reference to a reference position to form a plurality of parallel first walls, each of which has side surfaces exposed to the first grooves;

cutting a plurality of parallel second grooves through the second piezoelectric plate into the second low-rigidity plate by grinding at positions determined with reference to the reference position to form a plurality of parallel second walls, each of which has side surfaces exposed to the second grooves;

forming first electrodes respectively over portions of the side surfaces of the first walls formed of the first piezoelectric plate;

forming second electrodes respectively over portions of the side surfaces of the second walls formed of the second piezoelectric plate;

closely attaching a top plate to the outer surface of the first piezoelectric plate to form first pressure chambers between the first walls;

closely attaching a bottom plate to the outer surface of the second piezoelectric plate to form second pressure chambers between the second walls; and attaching an orifice plate provided with a plurality of ink jets to the end surface of the main plate so that the ink jets coincide respectively with the first and second pressure chambers.

2. A method of manufacturing a print head for an ink-jet printer, according to claim 1, wherein said first and second electrodes are formed by an electroless plating process.

3. A method of manufacturing a print head for an ink-jet printer, according to claim 1, wherein said first and second low-rigidity plates have surfaces exposed to the first and second grooves, respectively, and the first and second electrodes are formed respectively over the entire surfaces of the first and second low-rigidity plates.

4. A method of manufacturing a print head for an ink-jet printer, according to claim 2, wherein the plating component of a plating solution used in the electroless plating process is nickel.

5. A method of manufacturing a print head for an ink-jet printer according to claim 2, wherein the plating component of a plating solution used in the electroless plating process is gold.

6. A method of manufacturing a print head for an ink-jet printer, including the steps of:

forming a main plate by superposing a first piezoelectric plate polarized in the direction of its thickness, a first low-rigidity film, a high-rigidity intermediate plate, the rigidity of which is greater than that of the first low-rigidity film, a second low-rigidity film, the rigidity of which is substantially the same as that of the first low-rigidity film and a second piezoelectric plate polarized in the direction of its thickness in a laminated structure;

applying heat and pressure to the laminated structure of the main plate so that the first and second low-rigidity films are hardened;

cutting a plurality of parallel first grooves through the first piezoelectric plate into the first low-rigidity film to form a plurality of parallel first walls, each of which has side surfaces exposed to the first grooves;

cutting a plurality of parallel first grooves through the second piezoelectric plate into the second low-rigidity film to form a plurality of parallel second walls, each of which has side surfaces exposed to the second grooves;

forming first electrodes respectively over portions of the side surfaces of the first walls formed of the first piezoelectric plate;

forming second electrodes respectively over portions of the side surfaces of the second walls formed of the second piezoelectric plate;

fixing a top plate to the outer surface of the first piezoelectric plate to form a first pressure chamber between the first walls;

fixing a bottom plate to the outer surface of the second piezoelectric plate to form a second pressure chamber between the second walls; and fixing an orifice plate provided with a plurality of ink jets to the end surface of the main plate so that the ink jets coincide respectively with the first and second pressure chambers.

7. A method of manufacturing a print head for an ink-jet printer, according to claim 6, wherein said first and second electrodes are formed respectively over the entire portions of the main plate exposed to the first and second grooves.

8. A method of manufacturing a print head for an ink-jet printer, according to claim 6, wherein said first and second low-rigidity films are structural adhesive films.

* * * * *